United States Patent
Rea et al.

(10) Patent No.: US 10,643,651 B1
(45) Date of Patent: May 5, 2020

(54) DETERMINING INSTABILITY ZONES OF A LASER OF A HEAT-ASSISTED MAGNETIC RECORDING HEAD

(71) Applicant: Seagate Technology LLC, Cupertino, CA (US)

(72) Inventors: Christopher J. Rea, Edina, MN (US); Drew Michael Mader, Bloomington, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 16/162,812

(22) Filed: Oct. 17, 2018

(51) Int. Cl.
| | | |
|---|---|---|
| *G11B 27/36* | (2006.01) |
| *G11B 7/125* | (2012.01) |
| *G11B 7/1263* | (2012.01) |
| *G11B 5/48* | (2006.01) |
| *H01S 5/068* | (2006.01) |
| *G11B 5/02* | (2006.01) |
| *G11B 5/455* | (2006.01) |
| *G11B 5/00* | (2006.01) |

(52) U.S. Cl.
CPC ............. *G11B 7/1263* (2013.01); *G11B 5/02* (2013.01); *G11B 5/455* (2013.01); *G11B 5/4866* (2013.01); *H01S 5/06804* (2013.01); *H01S 5/06808* (2013.01); *G11B 2005/0021* (2013.01)

(58) Field of Classification Search
CPC ..... G11B 5/00; G11B 20/10009; G11B 27/36; G11B 20/18; G11B 7/00736; G11B 7/0062; G11B 7/125; G11B 7/126

USPC .......... 360/25, 31, 53; 369/116, 47.1, 59.11, 369/120, 121
See application file for complete search history.

(56) References Cited

U.S. PATENT DOCUMENTS

| | | | |
|---|---|---|---|
| 4,737,798 A | 4/1988 | Lonis et al. | |
| 7,212,361 B1* | 5/2007 | Pederson ........... | G01R 31/3171 360/31 |
| 9,074,941 B1* | 7/2015 | Krichevsky .............. | G01K 7/01 |
| 9,136,666 B1 | 9/2015 | Norberg et al. | |
| 9,281,659 B1* | 3/2016 | Tatah .................. | H01S 5/06804 |
| 9,595,288 B1 | 3/2017 | Chu et al. | |
| 9,984,719 B2* | 5/2018 | Matousek .............. | G11B 7/126 |
| 2008/0063016 A1 | 3/2008 | Bhatia et al. | |

OTHER PUBLICATIONS

Haigh et al., "Parallel Learning and Decision Making for a Smart Embedded Communications Platform", Raytheon BBN Report 8579, Aug. 20, 2015, pp. 1-22.
Rondeau, "Application of Artificial Intelligence to Wireless Communications", Sep. 20, 2007, 198 pages.

* cited by examiner

*Primary Examiner* — Nabil Z Hindi
(74) *Attorney, Agent, or Firm* — Mueting, Raasch & Gebhardt, P.A.

(57) ABSTRACT

Stability or instability zones are determined for ambient temperatures and one or more operational parameters applied to a heat-assisted magnetic recording head. Operations within the stability or instability zones resulting in respective stable or unstable operation of a laser of the recording head. During operation of the recording head, it is determining that a current ambient temperature and currently applied values of the one or more operational parameters are at or near one of the instability zones, and a write operation of the recording head is modified in response.

19 Claims, 6 Drawing Sheets

DETERMINING INSTABILITY ZONES OF A LASER OF A HEAT-ASSISTED MAGNETIC RECORDING HEAD

SUMMARY

The present disclosure is directed to determining instability zones of a laser of a heat-assisted magnetic recording head. In one embodiment, instability zones are determined for ambient temperatures and one or more operational parameters applied to a heat-assisted magnetic recording head that writes to a recording medium. Operations within the instability zones result in instability in operation of a laser of the recording head. During operation of the recording head, a current ambient temperature and currently applied values of the one or more operational parameters are determined to be at or near one of the instability zones. A write operation of the recording head is modified in response thereto.

In other embodiments, instability zones are determined for ambient temperatures and one or more operational parameters applied to a heat-assisted magnetic recording head that writes to a recording medium. Operations within the instability zones result in instability in operation of a laser of the recording head. During operation of the recording head, a current ambient temperature and currently applied values of the one or more operational parameters are determined to be outside of the instability zones and it is further determined that the laser is currently operating unstably. Alternatively during the operation, a current ambient temperature and currently applied values of the one or more operational parameters are determined to be inside of the instability zones and it is further determined that the laser is currently operating stably. In either case, a boundary of instability zones is modified in response thereto. These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1:
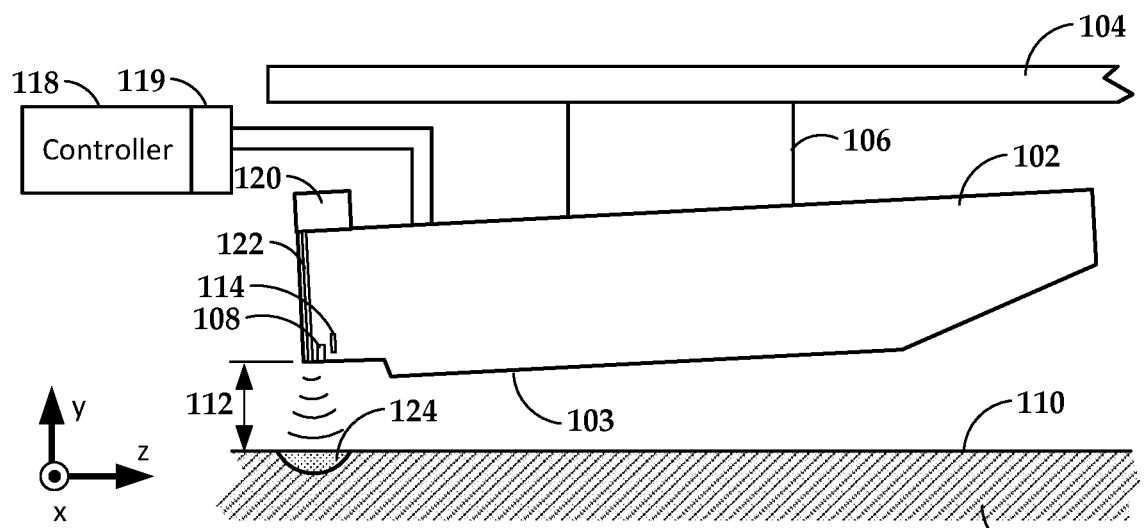
FIG. 1 is a side view of a slider assembly according to an example embodiment.

The present disclosure generally relates to data storage devices that utilize magnetic storage media, e.g., disks. Data storage devices described herein use a particular type of magnetic data storage known heat-assisted magnetic recording (HAMR), also referred to as energy-assisted magnetic recording (EAMR), thermally-assisted magnetic recording (TAMR), and thermally-assisted recording (TAR). This technology uses an energy source such as a laser to create a small hotspot on a magnetic disk during recording. The heat lowers magnetic coercivity at the hotspot, allowing a write transducer to change magnetic orientation, after which the hotspot is allowed to rapidly cool. Due to the relatively high coercivity of the medium after cooling, the data is less susceptible to data errors due to thermally-induced, random fluctuation of magnetic orientation known as the superparamagnetic effect.

A HAMR device uses a near-field transducer to concentrate optical energy into the optical spot in a recording layer. The hotspot raises the media temperature locally, reducing the writing magnetic field required for high-density recording. A waveguide integrated into a read/write head can be used to deliver light to the near-field transducer. Light from a light source, such as an edge-emitting laser diode mounted to an outside surface of the read/write head, is coupled into the waveguide through waveguide input coupler or a spot size converter.

Because the bit boundaries in a HAMR device are defined by the hotspot, the characteristics of the hotspot can have a significant effect on performance. For instance, if the hotspot is too big or too small, the corresponding track widths will be too big or too small. The hotspot can also affect timing of the bit sequences, as a too big or too small hotspot will result in the starting edge of the first bit being detected sooner or later than expected, respectively. One system characteristic that has a significant effect on hotspot size is the power being applied to the laser when it is activated during recording.

In some drives, laser power has found to become unstable under some conditions. This instability, sometimes referred to as "mode hopping," causes the optical output of the laser to become unpredictable and to increase or decrease outside of normal operating range. If the optical output is too large, the tracks may be written wide and adjacent track data may be affected. If the optical output is too small, the tracks will be written narrower which can result in a decrease in signal-to-noise ratio (SNR). In either case, laser instability can result in increased error rate or loss of data. Further, the characteristics of the laser can change over time, such that a laser that initially operates stably under a known set of operating conditions can later become unstable under those same conditions.

This disclosure relates to techniques used to dynamically determine stable operating conditions for a HAMR laser during operation. This involves not only identifying stable operational regions at the factory, e.g., during qualification testing, but determining changes in the stable regions as the device ages. In the latter case, the operating parameter of the laser (and possibly other components on the HAMR head) can be adjusted to ensure the optical output of the laser is predictable and controllable over the life of the drive.

In FIG. 1, a block diagram shows a side view of a HAMR read/write head 102 according to an example embodiment. The read/write head 102 may also be referred to herein as a head, a slider, write head, read head, recording head, etc. The read/write head 102 is coupled to an arm 104 by way of a suspension 106, e.g., a gimbal. The read/write head 102 includes read/write transducers 108 at a trailing edge that are held proximate to a surface 110 of a magnetic recording medium 111, e.g., a magnetic disk.

A controller 118 is coupled to the read/write transducers 108, as well as other components of the read/write head 102, such as heaters 114, sensors, etc. The controller 118 may be part of general- or special-purpose logic circuitry that controls the functions of a storage device that includes at least the read/write head 102 and recording medium 111. The controller 118 may include or be coupled to interface circuitry 119 that include circuits such as preamplifiers, buffers, filters, digital-to-analog converters, analog-to-digital converters, decoders, encoders, etc., that facilitate electrically coupling the logic of the controller 118 to the signals used by the read/write head 102 and other components.

The illustrated read/write head 102 is configured as a HAMR device, and so includes additional components that form a hotspot 124 on the recording medium 111 near the read/write transducer 108. These components include a laser 120 (or other energy source) and a waveguide 122. The waveguide 122 delivers light from the laser 120 to components near the read/write transducers 108, such as a near-field transducer that emits a tightly focused stream of energy to form the hotspot 124. The read/write transducers 108 also include a magnetic pole that applies a magnetic field to the hotspot 124 and the surrounding area. Because of the high coercivity of the recording medium 111, only the hotspot 124 is affected by the magnetic field due to the hotspot 124 being heated above the Curie temperature. Therefore, the size and shape of the hotspot 124 affects the geometry of the bits written to the recording medium 111.

Figure 2:
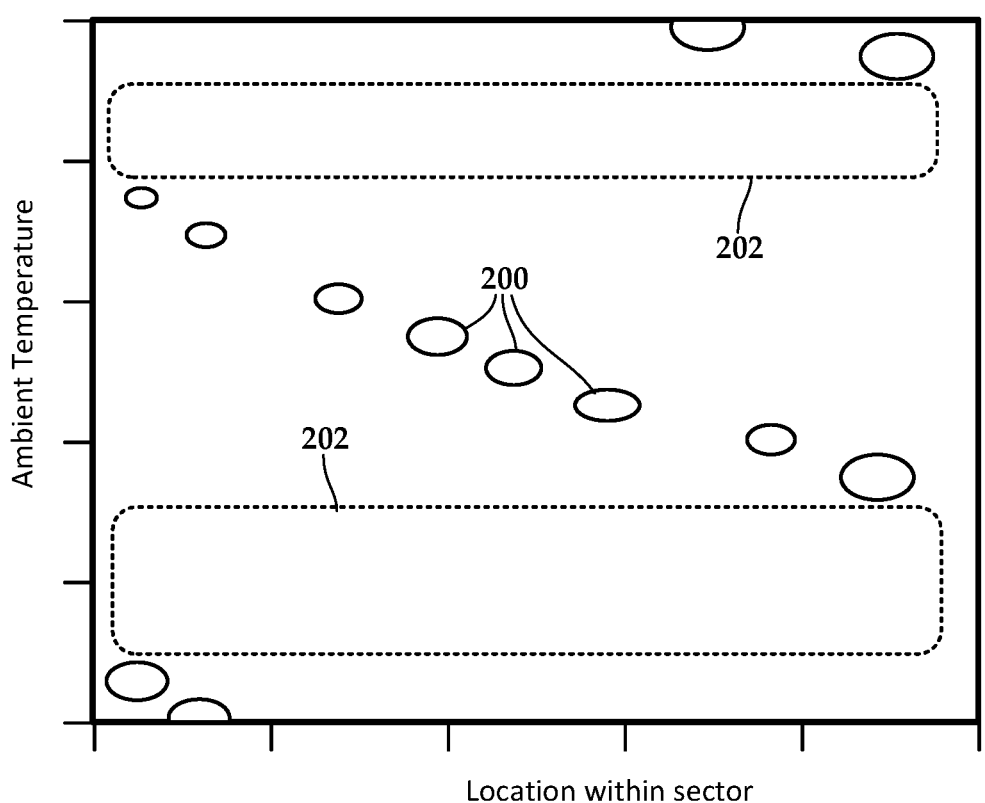
FIG. 2 is a graph showing laser stability and instability regions in a device according to an example embodiment.

In FIG. 2, a graph shows regions of instability for combinations of two variables according to an example embodiment. The shapes (e.g., ovals 200) indicate combinations of ambient temperature and location within which instability was detected. These shapes 200 generally define instability zones. Areas outside of the shapes, e.g., regions 202, can be designated as safe zones. The instability zones 200 can be found, for example, by writing data (e.g., a pure tone, random data) to a series of sectors at different ambient temperatures and then analyzing phase shifts of the written bits in each sector. Note that the change in hotspot geometry noted above changes the location of bit transitions as well as track width. Thus, by looking at the level of phase shifts in the written tones, areas where the laser operation was unstable can be identified. In other cases, an optical sensor (e.g., a bolometer) can be used to directly monitor the laser power and detect instability. In other examples, the width of user data tracks or test tracks can be measured by moving a read transducer at different crosstrack offsets from center. A significant variation in track width can also be an indication of laser instability. This track width measurement can be used instead of or together with the phase shift measurement.

As seen in FIG. 2, a HAMR laser has regions of instability that are affected at least by operational temperature, and maybe other parameters (e.g., shape of applied current curves). Among the inputs that affect operational temperature include ambient temperature, the operation of clearance heaters, laser bias current, and laser boost current, time profile of laser current, writing time within and across sectors, relative linear velocity of the disk (which can affect cooling), etc. The safe zones can initially be mapped out for each read/write head in a drive during initial testing (e.g., factory certification testing). Based on this testing, a series of safe zones can be defined for each head. These definitions are stored and used in operation of the drive.

Generally, a controller can use sensors and currently applied parameters (e.g., laser bias current, laser boost current, pre-write read heater current, radial zone of operation) to determine if the laser in moving toward an unstable zone of operation, and change operational parameters in order to remain in a stable zone of operation. The operational parameters that may be changed include delaying a write, changing laser activation parameters (e.g., pre-boost, bias current, boost current), changing clearance heater power (e.g., changing a pre-write read heater current), changing a head used in a write, activating, deactivating, or changing a power value of a heater attached to or integrated with the laser, etc.

Figure 3:
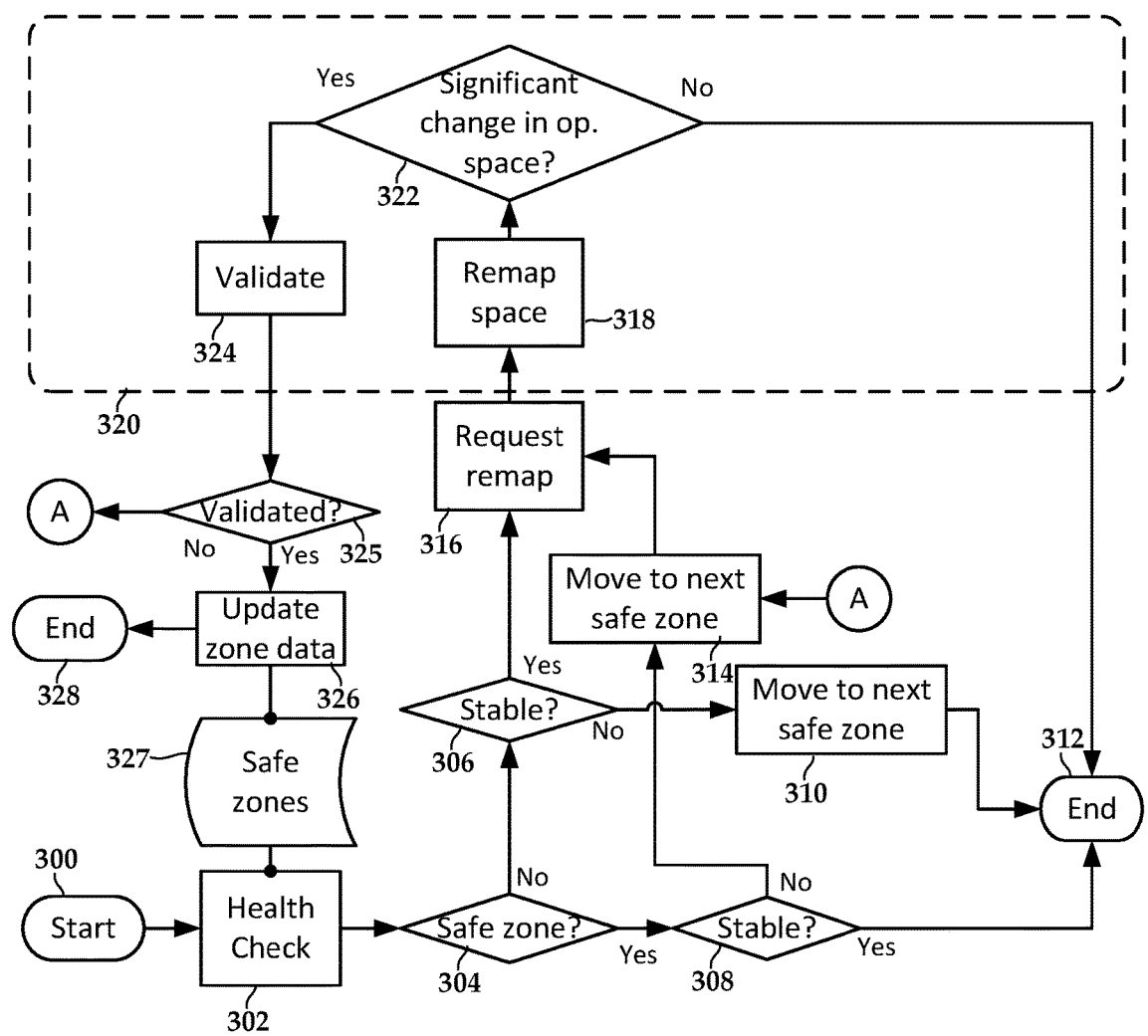
FIG. 3 is a flowchart showing use of instability zones according to an example embodiment.

As a drive ages, it is expected that the regions of instability will shift. Therefore, the drive will continuously monitor for instability via techniques described herein, e.g., phase shift of test signals, monitoring via optical sensor. If instability is detected in what is currently considered a safe operating zone, a retraining event is triggered. The retraining event can be local or global, e.g., used for one or multiple heads. In FIG. 3, a flowchart illustrates retraining of a drive controller according to an example embodiment.

A start event 300 is triggered by a timer or an error event. In response to the event 300, the system performs a health check 302 that determines 304 whether the system is currently operating in a safe zone. If this determination 304 is true or false, another determination 306, 308 is made to see if the laser operation is stable. If blocks 304 and 308 both return 'yes,' then the system is in a safe operating zone and is stable, and so the procedure ends 312. If blocks 304 and 306 both return 'no,' then the system is not operating a safe operating zone and is unstable, and so the system parameters are moved 310 to the next safe zone. As this corresponds to the expected behavior, the procedure ends 312.

If determination 304 returns 'yes' (in safe zone) but 308 returns 'no,' (unstable) then the system also moves 314 to another safe zone. However, this does not correspond to the expected behavior, so a request 316 is made to remap 318 the safe zone regions. The actual remapping 318 may be configured as a background process 320, which occurs during a time when the drive is idle or lightly utilized. For example, block 316 may involve setting a system variable that is later read and acted upon. Similarly, if determination 304 returns 'no' (not in safe zone) but 308 returns 'yes,' (stable) then the system does not need to change currently operating safe zone parameters, but is not the expected behavior. Thus the request 316 is made to remap 318 in this event as well.

The remapping 318 may occur locally (in a region near to the current operating point) or globally (over the possible operating ranges of the drive). Once the space is remapped, it is determined 322 whether a significant change in operational space has been found. A significant change in operational space may be defined by a statistically significant change in the width of the stable zone, and/or by the location. If there is no significant change, then the procedure exits 312. However, if a significant change is found, it may be validated 324 by additional testing. If it is determined 325 that the validation 324 was successful, the zone data is updated 326 in a database 327, and the procedure ends 328. If the validation 324 was not successful (block 325 returns 'no'), then the process may move 314 to another safe zone and request 316 a remap later.

The thresholds used by decision blocks 306, 308, 322 may be dependent on the drive usage conditions and overhead requirements. For example, under heavy usage, the thresholds used to determine whether operational changes are needed may be higher to avoid using computational and storage resources. Generally, a controller utilizing this procedure will determining if the drive is moving from a safe zone of operation, and if so specify a new operational condition can be set to improve stability. This is accompanied by a periodic or repeated re-evaluation as to whether the safe zones of operation are changing with time. If the operational space of the safe zones is too small, this may be flagged and can affect operation further, e.g., signal to host machine, decrease throughput, increase validation of written data, etc.

Figure 4:
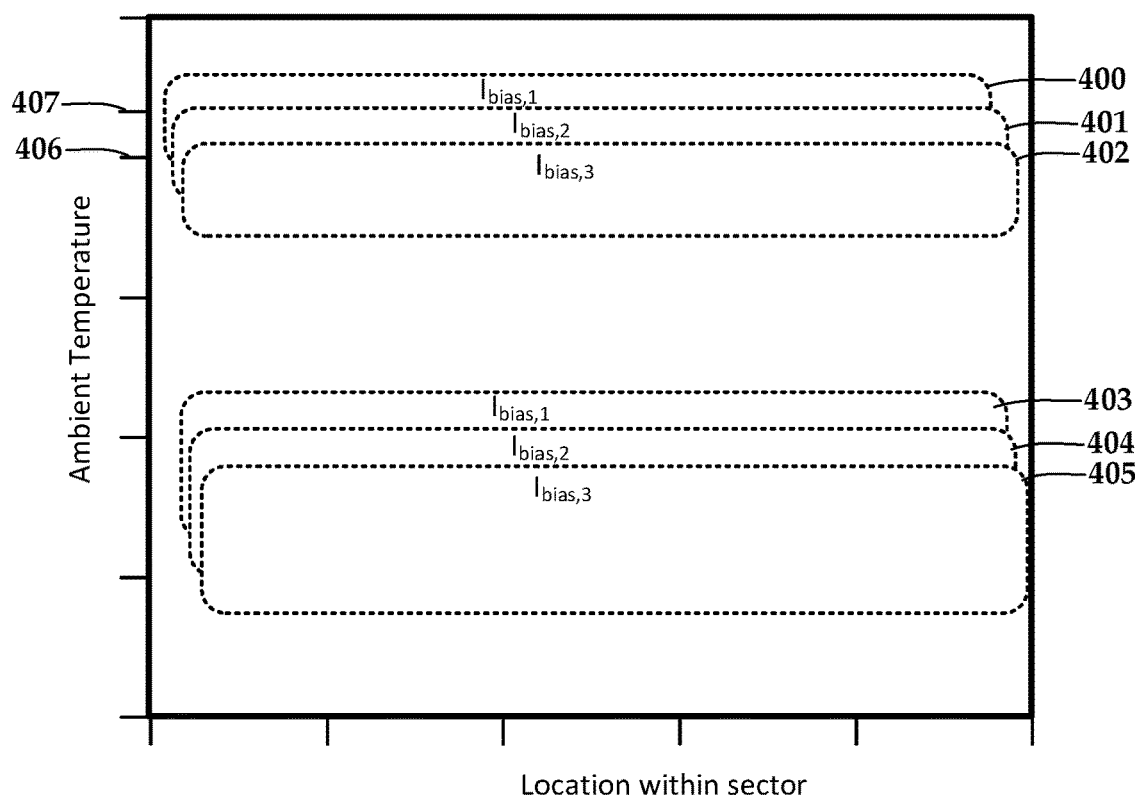
FIG. 4 is a graph showing effects of an operational parameter on instability zones according to an example embodiment.

In FIG. 4, a graph illustrates an example of how variable can be changed to achieve stability according to an example embodiment. Regions 400-405 represent current regions of safe operation similar to regions 202 shown in FIG. 2. Regions 400, 401 represent safe zones for a first laser diode bias current, regions 402, 403 represent safe zones for a second laser diode bias current, and 404, 405 represent safe zones for a third laser diode bias current. While the drive cannot typically control ambient temperature, it can change bias current applied to the laser, which does not cause the laser to emit light but generally puts the laser in a state where it can be quickly activated. Different bias currents will result in different steady-state laser temperatures, thus allowing the shifting of the laser to a stable mode.

If, in an initial operating mode, the drive is operating at ambient temperature 406, the second bias current will be applied to the laser and the system is operating in the region 401. If the ambient temperature rises to temperature 407, then the first bias current is used, shifting operation to region 400. This example can be extended to other laser current parameters, such as boost, overshoot, etc. Laser boost is an overshoot in applied current at the start of the laser turn-on that can rapidly increase the operating temperature. Laser boost is used in some systems, but not in others. Similarly, the example can be extended to other parameters that can affect laser heat, such as laser heater current, clearance heater currents (read and/or write clearance heaters) on the head, write coil currents, etc. A combination of these parameters can be varied separately or together. Unlike conventional recording, in HAMR there is a range of write coil currents and laser power that have small impact on the recording performance, but can significantly affect the laser temperature.

Figure 5:
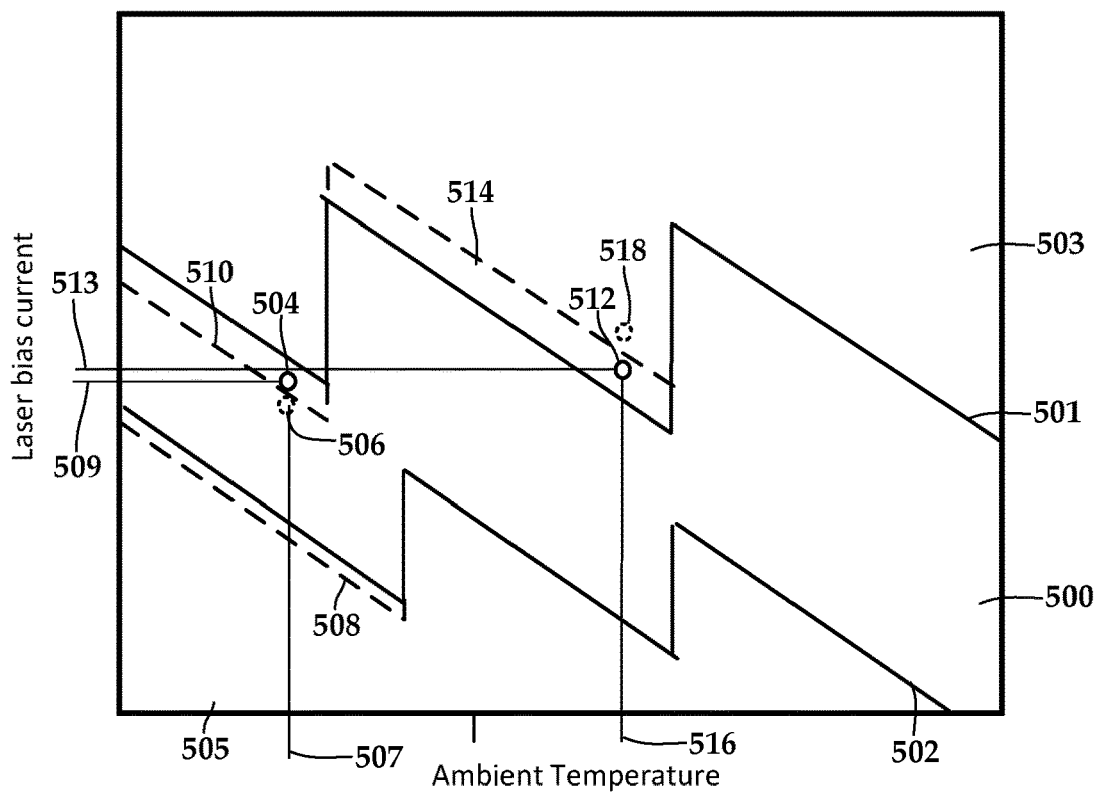
FIG. 5 is a graph showing modification of instability zones according to an example embodiment.

In FIG. 5, a graph illustrates a relationship between ambient temperature and laser bias current according to another example embodiment. Generally, the region 500 between boundaries 501, 502 is a safe zone or stability zone, which can be used to define a laser bias current based on the present ambient temperature of the drive. The other regions 503, 505 are instability zones. As noted above, other operating parameters can be used instead of or in addition to laser bias current to define the zones 500, 503, 505. Where two or more operating parameters are defined, the safe zones can be defined as volumes having three or more dimensions.

For purposes of this example, point 504 represents an operating point at which the laser is currently set, which should result in stable laser output. As noted above, even when operating within an indicated safe zone, laser instability may be seen over time, e.g., due to aging of the laser, change in thermal properties of the head, etc. For example, during operation of the recording head, it may be determined that at current ambient temperature 507 and currently applied value 509 of the one or more operational parameters (laser bias current in this example) as represented by point 504 are within zone 500 and therefore outside of the instability zones 503, 505. However, if it is determined that the laser is currently operating unstably at this point 504, a boundary of the zones 500, 503, 505 are modified. For example, a boundary between the safe zone 500 and the instability zone 503 may be altered in the database as indicated by the dashed line 510, which places point 504 in the instability zone 503.

Using a procedure such as shown in FIG. 3, the retraining or remapping of the space 500 may also determine that the laser bias current at point 506 results in stable laser output, thus this point 506 is within a region of stability. Thus, the new boundary 510 is located such that the instability zone 503 includes the current point 504 and excludes the stable point 506, and also change the operating parameter (laser bias) to subsequently operate at this point 506. This may be considered a local boundary change, because it only affects regions near the present operating point 504. This remapping may also extend to the lower limits of the safe zone, as indicated by dashed line 508. Because the drive may not be able significantly affect its ambient temperature, remapping of other parts of the stability boundaries 501, 502 may be delayed until the drive detects a significant change in ambient temperature.

A similar change may also be made if the laser is operating stably in an instability zone. For example, during operation of the recording head, the system determines that at point 512, the current ambient temperature 516 and currently applied value 513 of the bias are inside instability zone 503, yet the system determines that the laser is currently operating stably at point 512. Using a procedure such as shown in FIG. 3, a boundary of instability zone 503 is modified in response as indicated by line 514. This may involve finding determining a region of instability of operation of the laser as indicated by point 518. The boundary of instability zone 503 is modified to exclude point 512 and to include the region of instability 518. Note that this modification may also affect the lower boundary 502 of the stability zone 500 at least near ambient temperature 516.

Figure 6:
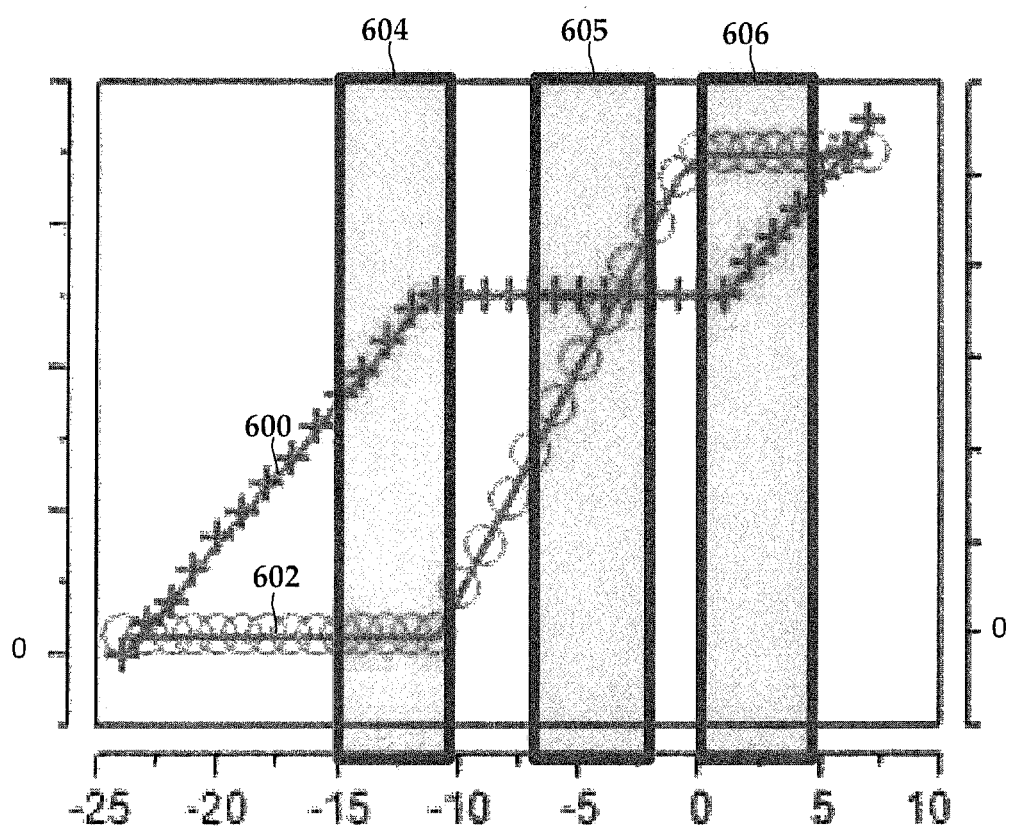
FIG. 6 is a graph showing the effect of multiple operational parameters on stability zones according to an example embodiment.

In FIG. 6, a graph shows measured effect of two parameters on laser diode temperature according to an example embodiment. The horizontal axis represents a temperature of the laser. Curve 600 represents a value of laser bias and curve 602 represents a value of power applied to read heater before writing. The left scale shows the zero point of the laser bias curve 600 and the right scale shows the zero point of the read heater curve 602. Regions 604-606 are safe zones in which the laser exhibits stable behavior at a particular ambient temperature.

By varying just the laser bias, the laser can be brought into safe zone 604. By varying both laser bias and read heater pre-heat, the laser can be brought into safe zones 605, 606. Note that as ambient temperature changes, the curves 600, 602 may shift to the left or the right, although the zones 604-606 should remain the same absent some change in the laser. Thus, the laser bias and/or heater values can be changed by a predetermined amount based on the magnitude and direction of the change in ambient temperature and the relations therebetween seen in this graph. Long term, the zones 604-606 may shift to the left or the right, and/or become wider or narrower. In that case, a remapping as described above may be triggered to obtain a new relation between the zones 604-606 and the operating parameters 600, 602.

Figure 7:
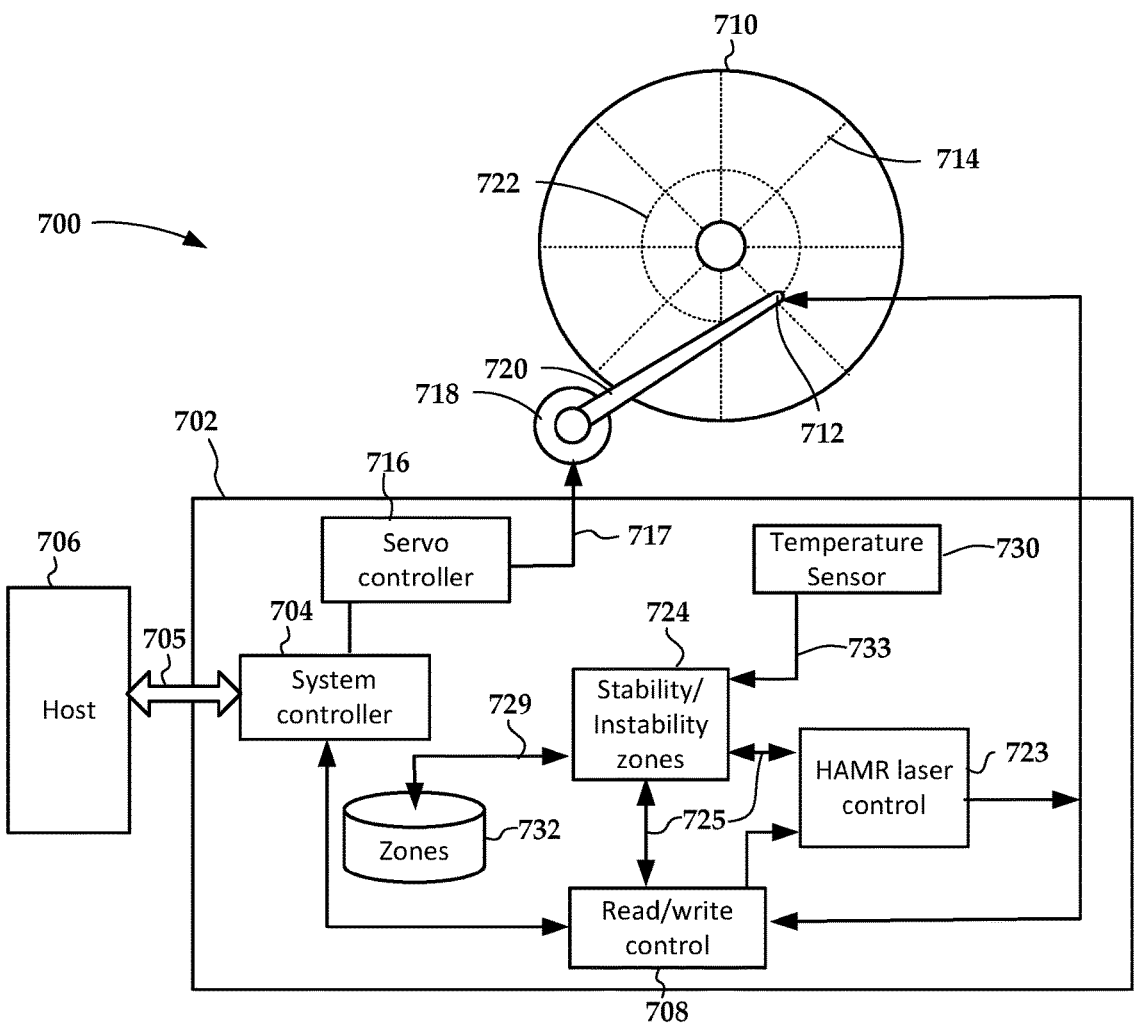
FIG. 7 is a block diagram of an apparatus according to an example embodiment.

In FIG. 7, a block diagram illustrates a system and apparatus 700 according to an example embodiment. The apparatus/system 700 may include a self-contained disk drive or a test fixture, e.g., for testing HAMR read/write heads and/or media. One or more circuit boards 702 of the apparatus includes a system controller 704 that processes read and write commands and associated data from a host device 706. The host device 706 may include any electronic device that can be communicatively coupled via host interface 705 to store and retrieve data from a data storage device, e.g., a computer, drive controller card, etc. The system controller 704 is coupled to a read/write channel 708 that reads from and writes to a surface of a magnetic disk 710.

The read/write controller 708 generally converts data between the digital signals processed by the data controller 704 and the analog signals conducted through one or more heads 712 during read operations. To facilitate the read operations, the read/write controller 708 may include analog and digital circuitry such as preamplifiers, filters, decoders, digital-to-analog converters, timing-correction units, etc. The read/write controller 708 also provides servo data read from servo wedges 714 on the magnetic disk 710 to a servo controller 716. The servo controller 716 uses these signals to provide a voice coil motor control signal 717 to an actuator 718. The actuator 718 moves an arm 720 upon which the heads 712 are mounted in response to the voice coil motor control signal 717. The read/write controller 708 may also perform clearance control operations, such as applying current to heaters (read and/or write heaters) integrated within the heads 712. Changing the heater currents changes a thermal protrusion of the heads 712, which affects a spacing between transducers on the heads 712 and a surface of the disk 710.

The apparatus/system 700 is configured for HAMR recording, and therefore the heads 712 each include an energy source (e.g., laser diode) that heats the magnetic disk 710 when recording. A HAMR laser controller 723 sends a current to activate the laser diode when recording. The HAMR laser controller 723 includes the ability to change a bias and/or boost current that is applied to the laser while recording user data sectors. The different currents can be used to cause the laser to operate in a thermal safe zone.

The apparatus/system 700 includes a stability/instability zones module 724 determines instability and stability zones for ambient temperatures and one or more operational parameters applied to the heat-assisted magnetic recording heads 712. Operations within the instability and stability zones respectively result in stability or instability in operation of a laser of the recording heads 712. Data 729 describing these zones may be initially stored in a database 732 during factory test, and accessed via the module 724 to cause a change in operational parameters 725 applied to the laser via module 725 and other components via read/write controller 708. If the stability/instability zones module 724 determines that a current ambient temperature 733 (obtained via temperature sensor 730) and currently applied values of the one or more operational parameters 725 are at or near one of the instability zones, a write operation of the recording head in response thereto, e.g., via signals to one or both of modules 708, 723. If the laser is found operating stably or unstably within respective instability or stability zones, then the stability/instability zones module 724 may modify a boundary of the instability zones within the database 732.

Figure 8:
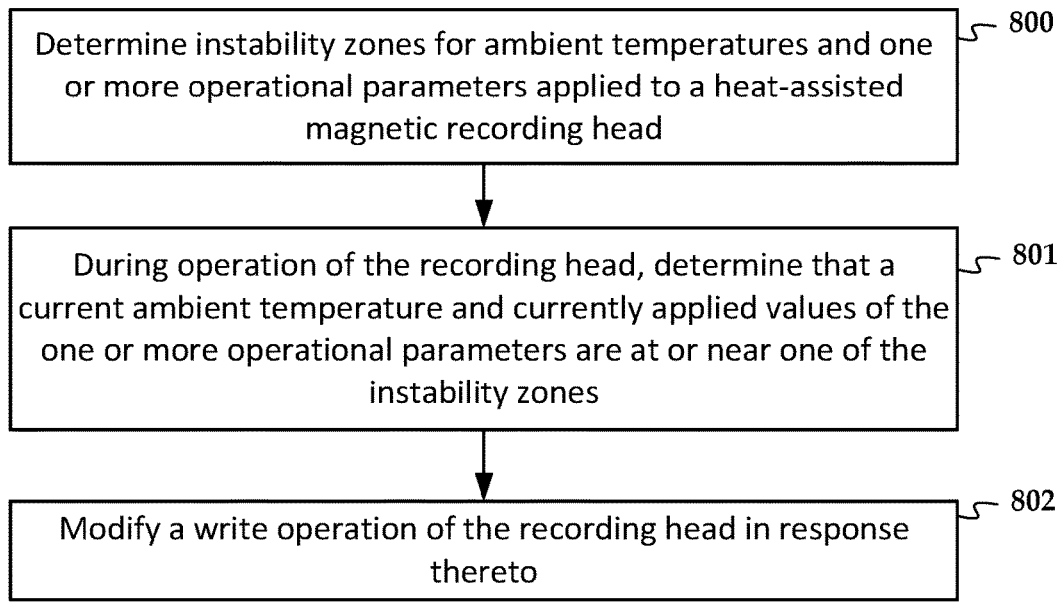
FIGS. 8 and 9 are flowcharts of methods according to example embodiments.

In reference now to FIG. 8, a flowchart illustrates a method according to an example embodiment. The method involves determining 800 instability zones for ambient temperatures and one or more operational parameters applied to a heat-assisted magnetic recording head. Operations within the instability zones result in instability in operation of a laser of the recording head. During operation of the recording head, it is determined 801 that a current ambient temperature and currently applied values of the one or more operational parameters are at or near one of the instability zones. A write operation of the recording head is modified 802 in response thereto.

Figure 9:
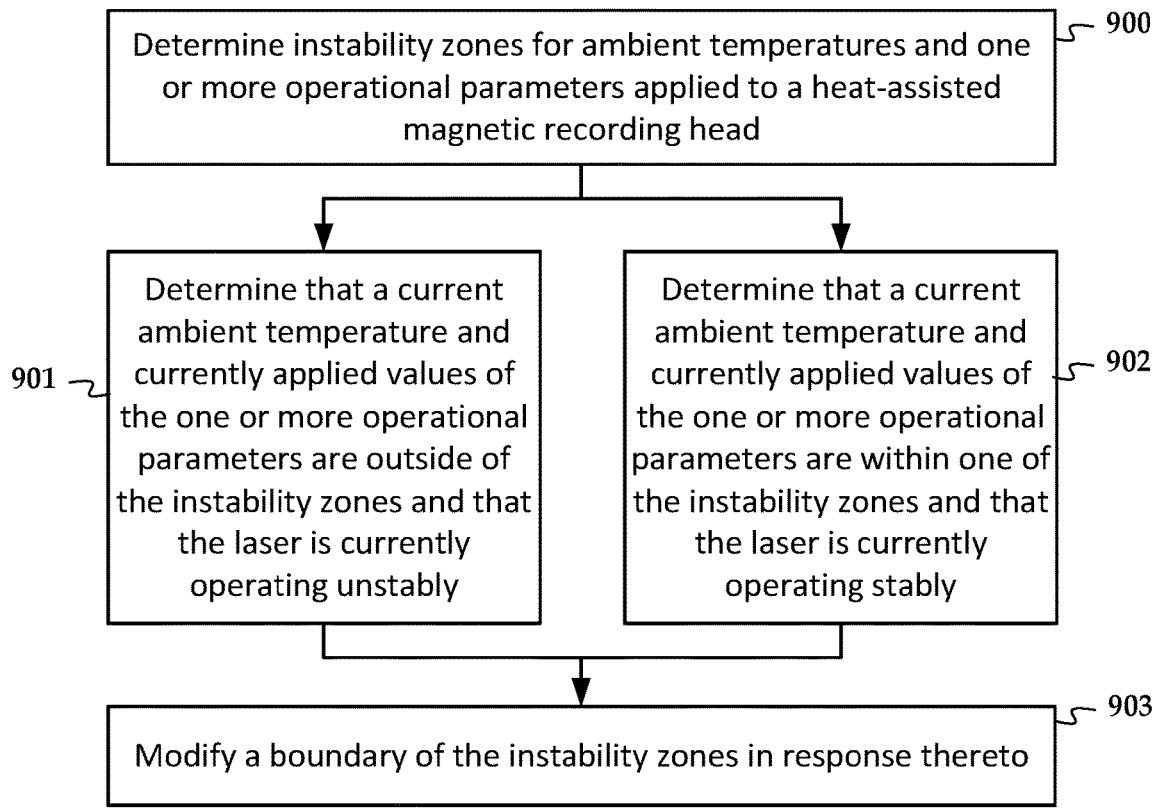

In reference now to FIG. 9, a flowchart illustrates a method according to an example embodiment. The method involves determining 900 instability zones for ambient temperatures and one or more operational parameters applied to a heat-assisted magnetic recording head. Operations within the instability zones result in instability in operation of a laser of the recording head. During operation of the recording head, it is determined 901 that that a current ambient temperature and currently applied values of the one or more operational parameters are outside of the instability zones and further determined that the laser is currently operating unstably. In addition or instead, during operation of the recording head it is determined 902 that that a current ambient temperature and currently applied values of the one or more operational parameters are within one of the instability zones and further determined that the laser is currently operating stably. In response to either of the conditions 901, 902, a boundary of the instability zones is modified 903 in response thereto.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method, comprising:
   determining instability zones for ambient temperatures and one or more operational parameters applied to a heat-assisted magnetic recording head that writes to a recording medium, the one or more operational parameters including one or more of a laser input bias current and a laser input boost current, operations within the instability zones resulting in instability in operation of a laser of the recording head;
   during operation of the recording head, determining that a current ambient temperature and currently applied values of the one or more operational parameters are at or near one of the instability zones; and
   modifying a write operation of the recording head in response thereto.

2. The method of claim 1, wherein the one or more or more operation inputs include a read clearance heater input that is applied before the write operation.

3. The method of claim 1, wherein modifying the write operation comprises delaying the write operation.

4. The method of claim 1, wherein modifying the write operation comprises changing one or more of a clearance heater current, a laser input bias current, a laser input boost current, and a write coil current.

5. The method of claim 1, wherein modifying the write operation comprises changing a current to a laser heater.

6. The method of claim 1, wherein modifying the write operation comprises using a different head for writing.

7. The method of claim 1, further comprising determining that the laser is currently operating unstably and operating outside the instability zones, and in response, adjusting a boundary of the instability zones.

8. The method of claim 1, further comprising determining that the laser is currently operating stably and operating inside one of the instability zones, and in response, adjusting a boundary of the instability zones.

9. An apparatus, comprising a controller coupled to laser control circuitry and operable to perform the method of claim 1 via the laser control circuitry.

10. A method, comprising:

determining instability zones for ambient temperatures and one or more operational parameters applied to a heat-assisted magnetic recording head that writes to a recording medium, operations within the instability zones resulting in instability in operation of a laser of the recording head;

during operation of the recording head, determining that a current ambient temperature and currently applied values of the one or more operational parameters are outside of the instability zones and further determining that the laser is currently operating unstably; and modifying a boundary of instability zones in response thereto.

11. The method of claim 10, wherein the one or more operational parameters include one or more of a laser input bias current and a laser input boost current.

12. The method of claim 10, wherein the one or more or more operation inputs include a read clearance heater input that is applied before the write operation.

13. The method of claim 10, wherein modifying the boundary of the instability zones comprises:

determining a region of stability of operation of the laser based on one or both of a phase shift of data written to the recording medium and a variation in width of a track written to the recording medium; and modifying the boundary of the instability zone to include the current ambient temperature and the currently applied values of the one or more operational parameters and to exclude the region of stability.

14. An apparatus, comprising a controller coupled to laser control circuitry and operable to perform the method of claim 10 via the laser control circuitry.

15. A method, comprising:

determining instability zones for ambient temperatures and one or more operational parameters applied to a heat-assisted magnetic recording head that writes to a recording medium, operations within the instability zones resulting in instability in operation of a laser of the recording head;

during operation of the recording head, determining that a current ambient temperature and currently applied values of the one or more operational parameters are inside one of the instability zones and further determining that the laser is currently operating stably; and modifying a boundary of instability zones in response thereto.

16. The method of claim 15, wherein the one or more operational parameters include one or more of a laser input bias current and a laser input boost current.

17. The method of claim 15, wherein the one or more or more operation inputs include a read clearance heater input that is applied before the write operation.

18. The method of claim 15, wherein modifying the boundary of the instability zones comprises:

determining a region of instability of operation of the laser based on one or both of a phase shift of data written to the recording medium and a variation in width of a track written to the recording medium; and modifying the boundary of the instability zone to exclude the current ambient temperature and the currently applied values of the one or more operational parameters and to include the region of instability.

19. An apparatus, comprising a controller coupled to laser control circuitry and operable to perform the method of claim 15 via the laser control circuitry.

* * * * *